(12) United States Patent
Steenbruggen

(10) Patent No.: US 8,664,683 B2
(45) Date of Patent: Mar. 4, 2014

(54) CARRIER AND OPTICAL SEMICONDUCTOR DEVICE BASED ON SUCH A CARRIER

(75) Inventor: Gerardus Henricus Franciscus Willebrordus Steenbruggen, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 785 days.

(21) Appl. No.: 12/519,431

(22) PCT Filed: Dec. 14, 2007

(86) PCT No.: PCT/IB2007/055115
§ 371 (c)(1),
(2), (4) Date: Jun. 16, 2009

(87) PCT Pub. No.: WO2008/078237
PCT Pub. Date: Jul. 3, 2008

(65) Prior Publication Data
US 2010/0044746 A1 Feb. 25, 2010

(30) Foreign Application Priority Data
Dec. 21, 2006 (EP) .................................. 06126824

(51) Int. Cl.
*H01L 33/00* (2010.01)

(52) U.S. Cl.
USPC ................... 257/99; 257/79; 257/81; 257/98; 257/100; 257/103; 257/189; 257/680; 257/704; 257/E33.056; 257/E33.058; 257/E33.061; 257/E33.067; 257/E33.073; 257/E25.032; 362/612; 362/618; 362/622; 362/627; 362/629; 362/632; 362/555; 362/583; 438/28; 438/29; 438/34; 438/35; 438/69; 438/70; 438/72; 438/106; 313/483; 313/489; 313/501; 313/504

(58) Field of Classification Search
USPC ......... 257/79, 81, 95, 98–100, 103, 189, 680, 257/704, E33.056, E33.058, E33.061, 257/E33.067, E33.07, E33.072, E33.073, 257/E25.032; 438/28, 29, 34, 35, 69, 70, 438/72, 106, FOR. 157, FOR. 453; 362/612, 362/618, 622, 627, 629, 632, 555, 583; 313/483, 489, 501–504
See application file for complete search history.

(56) References Cited

U.S. PATENT DOCUMENTS 4,929,965 A * 5/1990 Fuse .............................. 347/238
6,871,982 B2 3/2005 Holman et al.
(Continued)

FOREIGN PATENT DOCUMENTS

| WO | 03036720 | A2 | 5/2003 |
| WO | 2004023522 | A2 | 3/2004 |
| WO | 2004100343 | A2 | 11/2004 |

*Primary Examiner* — Meiya Li
(74) *Attorney, Agent, or Firm* — David Zivan; Mark Beloborodov

(57) ABSTRACT

A method for providing, on a carrier (40), an insulative spacer layer (26) which is patterned such that a cavity (27) is formed which enables connection of an optical semiconductor element (41) to the intended conductor structure (22) when placed inside the cavity (27). The cavity (27) is formed such that it, through its shape, extension and/or depth, accurately defines a location of an optical element (45; 61) in relation to the optical semiconductor element (41). Through the provision of such a patterned insulative spacer layer, compact and cost-efficient optical semiconductor devices can be mass-produced based on such a carrier without the need for prolonged development or acquisition of new and expensive manufacturing equipment.

5 Claims, 4 Drawing Sheets

(56) References Cited

U.S. PATENT DOCUMENTS

| | | |
|---|---|---|
| 6,964,877 B2 | 11/2005 | Chen et al. |
| 2003/0063465 A1 | 4/2003 | McMillan et al. |
| 2003/0189829 A1* | 10/2003 | Shimizu et al. ............... 362/240 |
| 2005/0153483 A1 | 7/2005 | Groenhuis et al. |
| 2006/0222285 A1 | 10/2006 | Minamio et al. |
| 2007/0170454 A1* | 7/2007 | Andrews ....................... 257/100 |

* cited by examiner

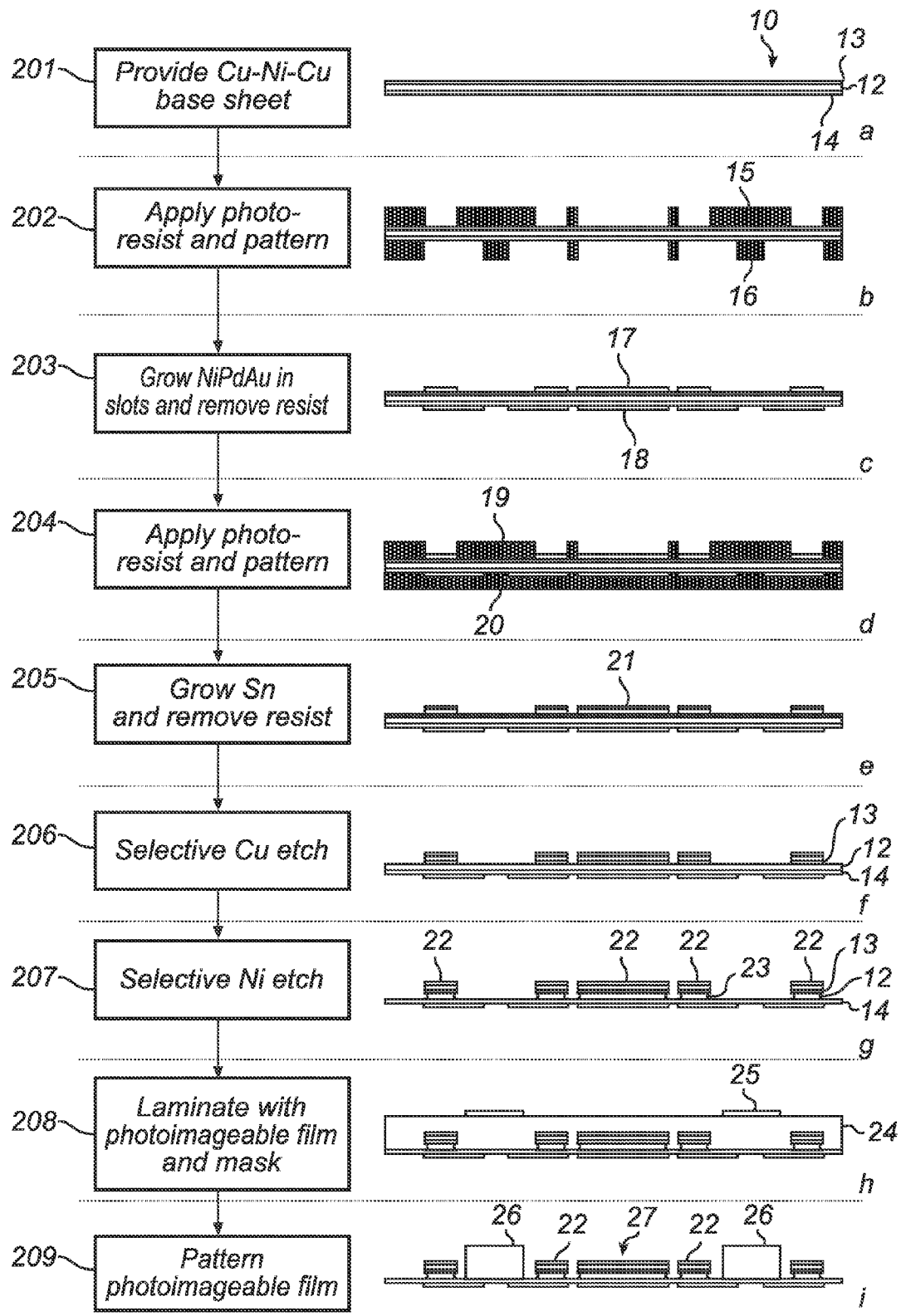

CARRIER AND OPTICAL SEMICONDUCTOR DEVICE BASED ON SUCH A CARRIER

TECHNICAL FIELD OF THE INVENTION

The present invention relates to a carrier for enabling accurate positioning of an optical element in relation to an optical semiconductor element to be connected to the carrier, and a method for manufacturing such a carrier.

The present invention further relates to an optical semiconductor device based on such a carrier and a method for manufacturing such an optical semiconductor device.

TECHNICAL BACKGROUND

Recently, optical semiconductor devices, including semiconductor lighting devices, such as, for example, single or multi-color LEDs, and sensing devices, such as, for example, various kinds of image sensors are increasingly incorporated in mass-market consumer products, such as mobile phones, computers, automobiles etc. In order to fulfill the very severe demands on cost, size, and reliability required for any component to be included in such products, much effort has been spent in the development of optical semiconductor devices. In particular, development of a package for an optical semiconductor element comprised in such an optical semiconductor device is an important area of development. It is also expected that packaging costs, for various kinds of optical semiconductor devices, will become dominant with respect to cost.

Due to the essential requirement of optical interaction with the surroundings inherent for optical semiconductor devices, standard electronics packaging techniques can typically not be used for such optical semiconductor devices. For example, an optical element, such as a lens or a diffuser typically needs to be accurately positioned with respect to the optical semiconductor element (for example, light-source or sensor) comprised in the optical semiconductor device. Furthermore, the optical semiconductor device should be made such that it can withstand various environmental conditions, such as, for example, temperature cycling without losing functionality.

In WO 2004/023522 a light emitting die package is disclosed, which, referring to FIG. 1, includes a substrate 1, a reflector plate 2 and a lens 3. After having mounted a light-emitting diode (LED) assembly 4 on the substrate 1, the reflector plate 2 is bonded on the substrate 1 so that it surrounds the LED assembly 4. The reflector plate has a ledge 5 for supporting the lens 3. After having bonded the reflector plate 2 to the substrate, the LED assembly 4 is encapsulated by a soft encapsulation material, and thereafter the lens 3 is positioned on the ledge 5 and adheres to the encapsulation material.

Although providing means for positioning a lens relative to a LED assembly, the optical semiconductor device package disclosed in WO 2004/023522 does not appear suited for mass production of very compact and cost-efficient optical semiconductor devices. It also appears cumbersome to connect to a circuit board due to its large footprint and awkwardly located connector pads.

Accordingly, there is a need for an improved optical semiconductor device, and, in particular for a more compact and less costly optical semiconductor device.

OBJECTS OF THE INVENTION

In view of the above-mentioned and other drawbacks of the prior art, a general object of the present invention is to provide an improved optical semiconductor device.

A further object of the present invention is to enable production of a more compact and less costly optical semiconductor device.

SUMMARY OF THE INVENTION

According to a first aspect of the present invention, these and other objects are achieved through a method for manufacturing a carrier for enabling accurate positioning of an optical element in relation to a optical semiconductor element to be connected to the carrier, the method comprising the steps of providing an electrically conductive multi-layer carrier base sheet having an upper carrier layer, a lower carrier layer, and an intermediate carrier layer between the upper and lower carrier layers; forming an upper conductor structure in the upper and intermediate carrier layers; and providing a patterned insulative spacer layer on an upper carrier layer side of the carrier base sheet, wherein the insulative spacer layer is patterned such that at least one cavity is formed in which the optical semiconductor element is connectable to the upper conductor structure, a depth of the cavity being greater than a height of the optical semiconductor element when connected to the carrier; and the cavity is formed to define a location of the optical element in relation to the optical semiconductor element.

By "optical element" should, in the context of the present application, be understood any element which interacts with light (including infrared (IR) and ultraviolet (UV) as well as visible electromagnetic radiation).

Such elements, for example, include lenses, collimators, reflectors, diffusers, optical filters, kinoforms, shadow masks and wavelength converting elements. Such elements may be provided as solid, pre-formed structures or as a liquid, which has optical properties or is made to assume a shape through which it obtains certain optical properties.

The "optical semiconductor element" is a semiconductor element, the function of which is, in any way, related to light. It may, for example, be a light-source, such as a light-emitting diode or a laser, or a detector sensitive to light.

By a conductor structure should here be understood a conducting structure which may be integral or comprised of a plurality of mechanically and/or electrically separated conductors. For example, a conductor pattern such as that typically found in a layer of a circuit board is a conductor structure.

The present invention is based upon the realization that a very mass-production friendly method for manufacturing highly compact conventional semiconductor devices can be adapted for manufacturing optical semiconductor devices by providing, on a carrier, an insulative spacer layer which is patterned such that a cavity is formed, which enables connection of a optical semiconductor element to the intended conductor structure when placed inside the cavity. The cavity is formed such that it, through its shape, extension and/or depth, accurately defines a location of an optical element in relation to the optical semiconductor element.

Through the provision of such a patterned insulative spacer layer, optical semiconductor devices can be mass-produced based on the carrier according to the present invention without the need for prolonged development or acquisition of new and expensive manufacturing equipment.

Furthermore, the provision of a patterned insulative layer for defining the location of an optical element in relation to an optical semiconductor element to be connected to the carrier facilitates manufacturing of panels including a large number of carriers, since the patterned insulative spacer layer may simultaneously be provided to a large number of carriers included in such a panel. Following the provision of the patterned layer, the panel may be used for the manufacture of a corresponding plurality of optical semiconductor devices, or it may be singulated to single carriers or tiles of carriers depending on the requirements of the manufacturer of the finished optical semiconductor devices.

Moreover, by producing the carrier based on a multi-layer conductive base carrier board, very compact packages are obtainable, having a foot-print which is only slightly larger than required by the optical element and/or optical semiconductor element comprised in the optical semiconductor device.

Additionally the patterned insulative layer can be adapted to perform the dual functions of enabling accurate positioning of an optical element and providing stability and integrity to the carrier. The patterned insulative spacer layer may, furthermore, advantageously be patterned such that individual carriers or optical semiconductor devices based on such carriers can be separated from each other substantially by cutting in the insulative film only. In other words, singulation can be achieved by cutting through a plastic only, rather than a combination of plastic and metal. In this manner, the stress on the optical semiconductor devices resulting from singulation can be reduced, which leads to an increased yield and reliability, and thereby lower costs and higher quality than obtainable through the prior art. Preferably, the insulative spacer layer is made of a somewhat resilient material in order to absorb movements of the other parts comprised in an optical semiconductor device based on the present carrier. Such movements may, for example, be induced by changes in the environment, such as temperature cycling.

According to one embodiment of the method for manufacturing the carrier, the step of providing an insulative spacer layer may comprise the steps of providing an insulative spacer layer on the upper carrier layer side of the carrier base sheet, and patterning the insulative spacer layer such that the cavity(ies) is/are formed.

Hereby, simultaneous formation of a large number of cavities, each being precisely positioned in relation to the upper conductor structure of the carrier is enabled. In particular, the present embodiment enables utilization of existing patterns on the carrier, such as the conductor structure and/or fiducial marks used when forming the upper conductor structure, for obtaining very high tolerances in the patterning step, in relation to the existing upper conductor structure. Furthermore, only one patterning, including alignment, is required for simultaneously forming cavities for a large number of carriers, each being positioned with respect to the respective corresponding conductor structure with a high precision.

The insulative spacer layer may advantageously be an insulative spacer sheet which is laminated to the upper carrier layer side of the carrier base sheet.

Alternatively, the insulative spacer layer may be formed by a liquid material which is distributed over the carrier or panel of carriers and subsequently cured. Such a liquid material may advantageously be distributed by means of conventional spin coating.

Moreover, the insulative spacer layer may be made of a photoimageable material, and the step of patterning may comprise the steps of positioning a mask between a light-source and the insulative spacer layer, exposing the insulative spacer layer through the mask by means of the light-source, and developing the pattern defined by the exposure.

By selecting a photoimageable material, such as an acrylic, a polyimide, such as Pyralux® PC 1000 by DuPont®, or a photoimageable spin-on material, such as Benzo-Cyclo-Butene (BCB), a patterned insulative spacer layer can be provided through very few and simple process steps. For the exposure, a contact mask or a shadow mask may be used depending on type of material, this and the other process steps being well known to the skilled person.

As an alternative to the photoimageable material, the insulative spacer layer may be made by a non-photoimageable material, which can subsequently be patterned using the conventional steps of applying a photo resist, patterning the resist, etching the insulative spacer layer and removing the resist. However, the use of a photoimageable material is preferred.

According to another embodiment of the invention, the step of providing a patterned insulative spacer layer may comprise the steps of providing a pre-patterned insulative spacer sheet in which the cavity is pre-formed, and laminating the pre-patterned insulative spacer sheet to the upper carrier layer side of the carrier base sheet such that a position of the pre-formed cavity corresponds to an intended position of the optical semiconductor element to be connected to the carrier.

Additionally, the method for manufacturing the carrier may further comprise the step of providing an intermediate insulative layer between the upper carrier layer and the patterned insulative spacer layer, wherein the intermediate insulative layer is configured such that electrical connection between the upper conductor structure and connector bumps provided on the optical semiconductor element is achievable through the intermediate insulative layer by applying heat and pressure to the optical semiconductor element when positioned on the intermediate film with the bumps facing the intermediate film and positions of the bumps corresponding to the conductor structure.

By providing such an intermediate insulative layer in a thermoplastic synthetic resin, the intermediate insulative layer can be made to locally liquify at positions between optical semiconductor element bumps and a corresponding conductor structure when heated and pressed between said bumps and conductor structure, thereby enabling local electrical connection through the intermediate insulative layer. The thickness of the intermediate insulative layer is preferably selected in relation to the bumps such that the intermediate insulative layer functions as a component underfill. Through the addition of such an intermediate insulative layer, the integrity of the carrier is further improved.

The intermediate insulative layer is, furthermore, advantageously made of a material selected among non-photoimageable materials.

Hereby, a cavity or cavities can easily be made in the overlying insulative spacer layer without affecting the intermediate insulative layer.

As an alternative to providing an intermediate insulative layer, the insulative spacer layer may be patterned such that the cavity is not through going, but so that a suitably thick layer remains through which the optical semiconductor element can be connected to the corresponding conductor structure.

Moreover, the intermediate carrier layer may be made of a different metal than the upper and lower carrier layers, this metal being selected such that the intermediate carrier layer is etchable by an etchant that leaves the upper and lower carrier layers substantially intact, thereby enabling under-etching of the upper carrier layer, such that recesses are formed in the conductor structure, enabling improved anchoring of a subsequently applied encapsulant.

The method for manufacturing the carrier may further comprise the step of forming a lower conductor structure in the lower carrier layer, such that leads are formed for enabling electrical connection of the optical semiconductor element to an external device, the leads being electrically isolated from each other.

The steps of the method according to the present first aspect of the present invention may, furthermore, be comprised in a method for manufacturing an optical semiconductor device having an accurate positioning of an optical element in relation to a optical semiconductor element included in the semiconductor device, the method further comprising the steps of connecting the optical semiconductor element to the upper conductor structure in the cavity formed by the patterned insulative spacer layer; and providing the optical element in the location defined by the patterned insulative spacer layer.

Further features and advantages of this method are described below in connection with the second aspect of the present invention.

According to a second aspect of the present invention, the above-mentioned and other objects are also achieved through a method for manufacturing an optical semiconductor device having an accurate positioning of an optical element in relation to a optical semiconductor element included in the semiconductor device, the method comprising the steps of providing a carrier including an electrically conductive multi-layer carrier base sheet having an upper carrier layer, a lower carrier layer, and an intermediate carrier layer between the upper and lower carrier layers, the upper and intermediate carrier layers having an upper conductor structure formed therein; and a patterned insulative spacer layer arranged on an upper carrier layer side of the carrier base sheet, wherein the insulative spacer layer is patterned such that at least one cavity is formed in which the optical semiconductor element is connectable to the upper conductor structure, a depth of the cavity being greater than a height of the optical semiconductor element when connected to the carrier; and the cavity is formed to define a location of the optical element in relation to the optical semiconductor element; connecting the optical semiconductor element to the upper conductor structure in the cavity formed by the patterned insulative spacer layer; and providing the optical element in the location defined by the patterned insulative spacer layer.

The optical semiconductor element may be connected to the upper conductor structures of the carrier by any means, such as through wire bonding, tape automated bonding (TAB), or flip-chip. In case of flip-chip connection, connector bumps provided on the optical semiconductor element are connected to a corresponding upper conductor structure, usually provided in the form of corresponding pads. The bumps may, for example, be connected to the pads through soldering or gluing by means of a conductive adhesive, which may be anisotropically conductive.

The method for manufacturing an optical semiconductor device according to the present invention may further comprise the step of forming a lower conductor structure in the lower carrier layer, such that leads are formed for enabling electrical connection of the optical semiconductor element to an external device, the leads being electrically isolated from each other.

The carrier may be provided with or without a lower conductor structure, with carriers not having a lower conductor structure typically being more rigid than carriers having a lower conductor structure.

According to one embodiment, the optical element may be provided by filling the cavity with a liquid, optically active substance which is adapted to act as an optical element, such as a diffuser, when covering the optical semiconductor element.

Alternatively, the step of providing the optical element may comprise the steps of positioning the optical element in the location defined by the patterned insulative spacer layer; and filling a space defined by the cavity and the optical element with a resilient optical compound, for reducing stress on the semiconductor device, which may result from expansions and contractions due to varying temperatures.

This resilient optical compound by be injected following positioning of the optical element, or be dispensed in the cavity before the optical element is positioned in its defined position.

According to a third aspect of the present invention, the above-mentioned and other objects are also achieved through a carrier for enabling accurate positioning of an optical element in relation to a optical semiconductor element to be connected to the carrier, the carrier comprising an electrically conductive multi-layer carrier base sheet having an upper carrier layer, a lower carrier layer, and an intermediate carrier layer between the upper and lower carrier layers, the upper and intermediate carrier layers having an upper conductor structure formed therein; and a patterned insulative spacer layer arranged on an upper carrier layer side of the carrier base sheet, wherein the insulative spacer layer is patterned such that at least one cavity is formed in which the optical semiconductor element is connectable to the upper conductor structure, a depth of the cavity being greater than a height of the optical semiconductor element when connected to the carrier; and the cavity is formed to define a location of the optical element in relation to the optical semiconductor element.

Furthermore, the carrier according to the present invention may advantageously be included in an optical semiconductor device, further comprising a optical semiconductor element which is connected to the upper conductor structure in the cavity formed by the patterned insulative spacer layer; and an optical element which is provided in the location defined by the patterned insulative spacer layer.

Further features and advantageous effects of this third aspect of the invention are largely analogous to those described above in connection with the first and second aspects of the present invention.

BRIEF DESCRIPTION OF THE DRAWINGS

These and other aspects of the present invention will now be described in more detail, with reference to the appended drawings showing a currently preferred embodiment of the invention, wherein:

FIG. 2 is a flow chart schematically illustrating a method for manufacturing a carrier according to a preferred embodiment of the present invention;

FIG. 3 schematically illustrates the carrier manufactured according to the method of FIG. 2 in states following the corresponding method steps;

DETAILED DESCRIPTION OF A PREFERRED EMBODIMENT OF THE INVENTION

Figure 1:
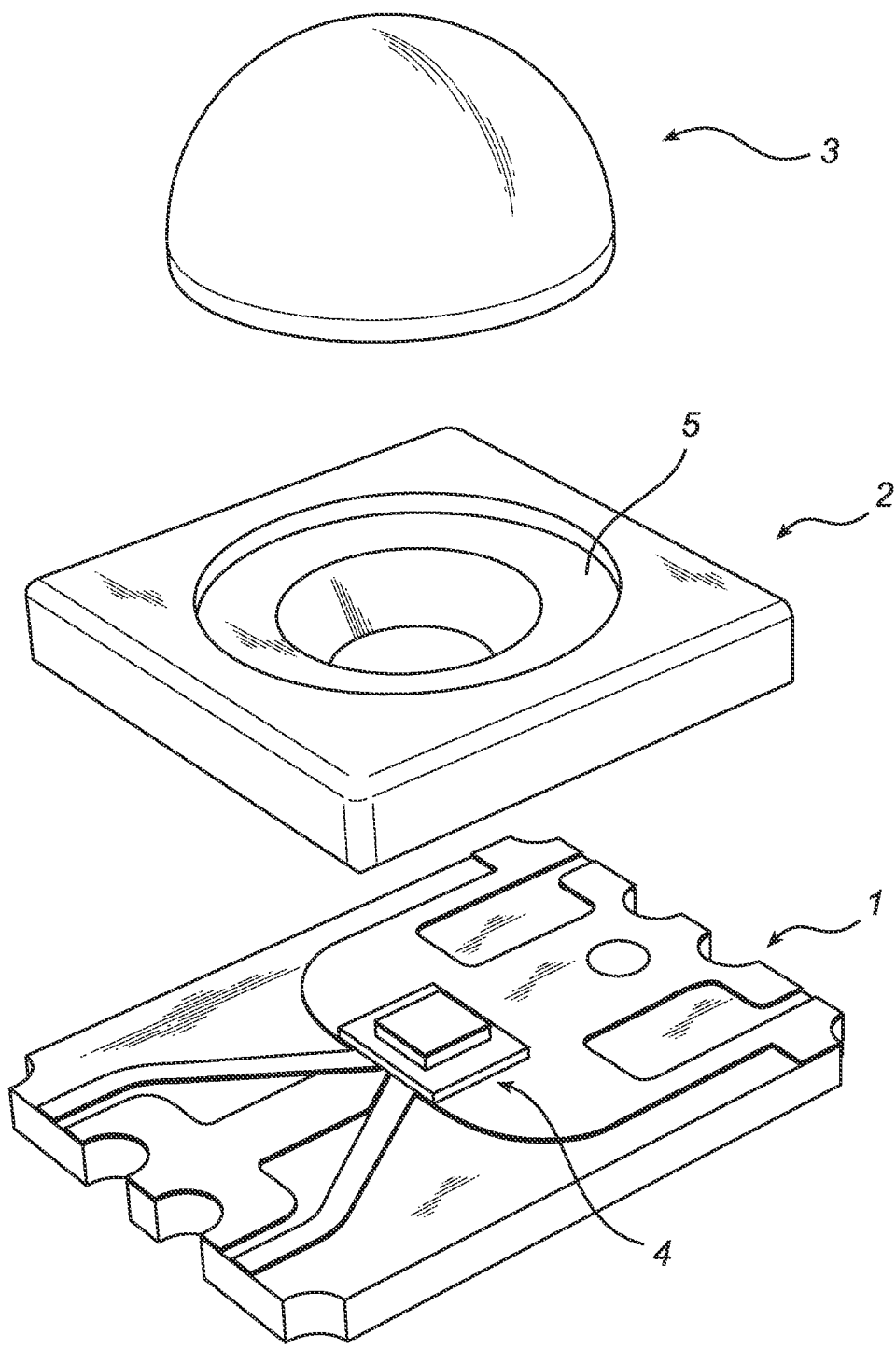
FIG. 1 is an exploded view of a prior art optical semiconductor device.

In the following description, the present invention is described with reference to a carrier in which a patterned insulative spacer layer is provided by laminating a photoimageable foil to the carrier base sheet and subsequently patterning the foil. It should be noted that this by no means limits the scope of the invention, which also includes providing the patterned insulative spacer layer as a pre-patterned foil or as a spin-on layer which is subsequently patterned.

Furthermore, in the carrier and optical semiconductor device described below, the carrier base sheet is made of multi-layer base sheet having a lower Cu-layer, an upper Cu-layer and a Ni-layer between the lower and upper Cu-layers. Subsequently, different further metal layers are grown on the upper and lower carrier layers corresponding to the upper and lower conductor structures. As is readily understood by a person skilled in the art, the materials of these different layers can be substituted by various other materials enabling formation of a carrier having a conductor structure, and enabling a good connection between the conductor structure and the element to be connected thereto.

A preferred embodiment of a carrier according to the present invention and a method for manufacturing such a carrier will now be described with reference to FIG. 2 which is a flow chart schematically illustrating such a method and FIG. 3 which schematically illustrates the carrier in states following the corresponding method steps of FIG. 2.

In a first step 201, a three-layer carrier base sheet 10, having an intermediate carrier layer 12 made of Ni and upper 13 and lower 14 carrier layers made of Cu is provided.

The base sheet is preferably manufactured by an additive process, starting with a Cu-layer, adding a Ni-layer to that (for example by deposition followed by galvanic plating) and subsequently adding a second Cu-layer in the same way.

In a subsequent step 202, photoresist layers 15, 16 are applied to the upper 13 and lower 14 carrier layers, respectively. The photoresist layers 15, 16 are patterned as indicated in FIG. 3b by conventional masking, exposing and developing of the applied photoresist layers.

In a next step 203, NiPdAu-layers 17, 18 are grown in the slots defined by the patterned photoresist layers 15, 16, and the photoresist is removed.

Thereafter, in step 204, new photoresist layers 19, 20 are applied to the upper 13 and lower 14 carrier layer, respectively. The upper photoresist layer 19 is patterned to expose the NiPdAu-layer 17 grown on portions of the upper carrier layer 13, and the lower photoresist layer 20 is left unpatterned.

In a following step 205, an Sn-layer 21 is grown on top of the NiPdAu-layer 17 on the upper carrier layer 13, in order to prepare the carrier for subsequent flip-chip mounting of a optical semiconductor element to the upper side of the carrier.

Following application of this Sn-layer 21, the uncovered portions of the upper carrier layer 13 are removed by means of a selective Cu etch in step 206, and in a subsequent step 207, the uncovered portions of the intermediate carrier layer 12 are removed by means of a selective Ni etch.

Through these two selective etch steps 206, 207, an upper conductor structure 22 is formed in the upper 13 and intermediate 12 carrier layers. Through the provision of different metals, which are selectively etchable, in the intermediate 12 and upper 13 carrier layers, an under etch can be performed, resulting in recesses 23 being formed as indicated at a representative location in FIG. 3 step g. These recesses 23 enable an improved anchoring of a subsequently applied encapsulant to the carrier base 10. The carrier is now held together by the still continuous lower carrier layer 14.

In a following step 208, a photoimageable film 24, such as a polyimide or acrylic foil, is laminated to the upper side of the carrier. The photoimageable film 24 is masked by a shadow mask, or, as in the case illustrated in FIG. 3 step h, by a contact mask 25. Subsequently, in step 209, the film 24 is patterned by exposing and developing the unmasked portions of the film 24 using exposure and development parameters which are adapted to the film material and thickness, resulting in a carrier as shown in FIG. 3 step i having a patterned insulative spacer layer 26 in which a cavity 27 is formed in which a optical semiconductor element is connectable to the upper conductor structure 22. The cavity is formed to have a depth which is greater than a height of the optical semiconductor element to be connected therein and to define a location of an optical element in relation to the optical semiconductor element.

Following the steps illustrated in FIG. 2 and FIG. 3, an optical semiconductor device can be formed by connecting a optical semiconductor element to the upper conductor structure 22 and providing an optical element in a location defined by the patterned insulative layer 26, as will be described below for two alternative embodiments with reference to FIG. 4 and FIG. 5, and FIG. 6 and FIG. 7, respectively.

A first embodiment of an optical semiconductor device according to the present invention and a method for manufacturing such an optical semiconductor device will now be described with reference to FIG. 4 and FIG. 5.

Figures 4, 5:
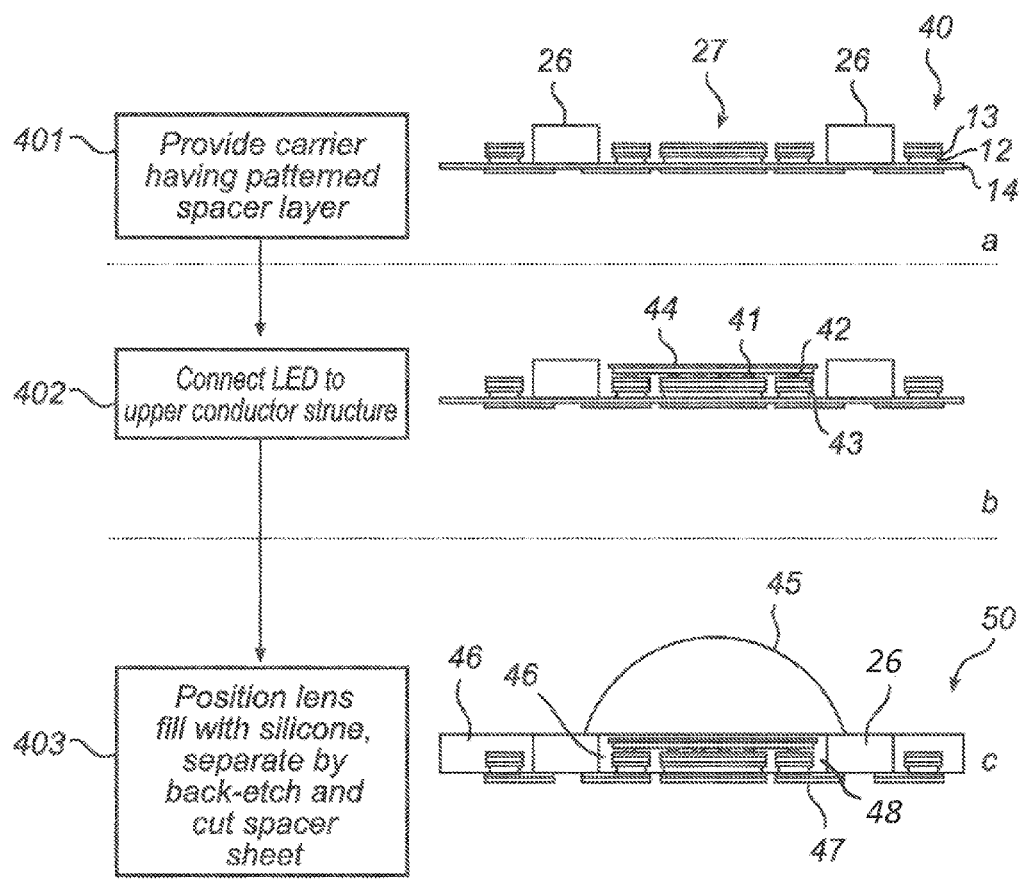
FIG. 4 is a flow chart schematically illustrating a method for manufacturing a first embodiment of an optical semiconductor device according the present invention.
FIG. 5 schematically illustrates the optical semiconductor device manufactured according to the method of FIG. 4 in states following the corresponding method steps.

Referring first to FIG. 4 and FIG. 5 step a, a carrier 40, such as that described above in connection with FIG. 2 and FIG. 3, with a three-layer carrier base sheet with the intermediate 12 and upper 13 carrier layers having an upper conductor structure 22, and the lower carrier layer 14 being continuous, and a patterned insulative spacer layer 26 provided on the upper side of the carrier such that a cavity 27 is formed, is provided in a first step 401.

In a subsequent step 402, an optical semiconductor device, here in the form of a light-emitting diode (LED) 41 is flip-chip connected to the upper conductor structure 22 in the cavity 27 formed in the patterned insulative spacer layer 26. More specifically, bumps 42 provided on the LED 41 are connected to corresponding pads 43 comprised in the conductor structure 22. For converting the blue light emitted by the LED 41 to white light, the LED 41 is, furthermore, provided with a color conversion plate 44.

In a following step 403, an optical element, here in the form of a lens 45 is provided in a location defined by the patterned insulative spacer layer 26 such that the lens 45 is positioned at a controlled and accurate distance from the LED 41 and centered over the LED 41. The space 48 defined by the cavity 27 and the lens 45 is thereafter filled with a resilient optical compound, here a transparent silicone 46 which simultaneously encapsulates the LED 41, absorbs forces resulting from movement of parts comprised in the optical semiconductor device 50 due to, for example, thermally induced expansion and contraction, and holds the optical semiconductor device 50 together such that uncovered portions of the lower carrier layer 14 can be etched, resulting in electrically separated leads from the upper conductor structure 22 to a thus formed lower conductor structure 47. As a plurality of optical semiconductor devices 50 are typically manufactured in one run on a panel, the panel is typically finally singulated into individual optical semiconductor devices. This final singulation or separation is advantageously carried out by cutting the patterned insulative spacer layer in appropriate locations. Hereby, there is consequently no need for cutting through metal layers, which might otherwise have led to a decreased yield due to stress on the optical semiconductor elements.

The space defined by the cavity 27 and the lens 45 may be filled, through a filling hole, by capillary action until filling material exits through an overflow hole provided on the opposite side Alternatively, a surplus of a liquid optical compound may first be dispensed in the cavity. Thereafter, the lens is positioned accurately and the surplus of optical compound is squeezed out around the perimeter of the lens, or an overflow hole.

A second embodiment of an optical semiconductor device according to the present invention and a method for manufacturing such an optical semiconductor device will now be described with reference to FIG. 6 and FIG. 7.

Figures 6, 7:
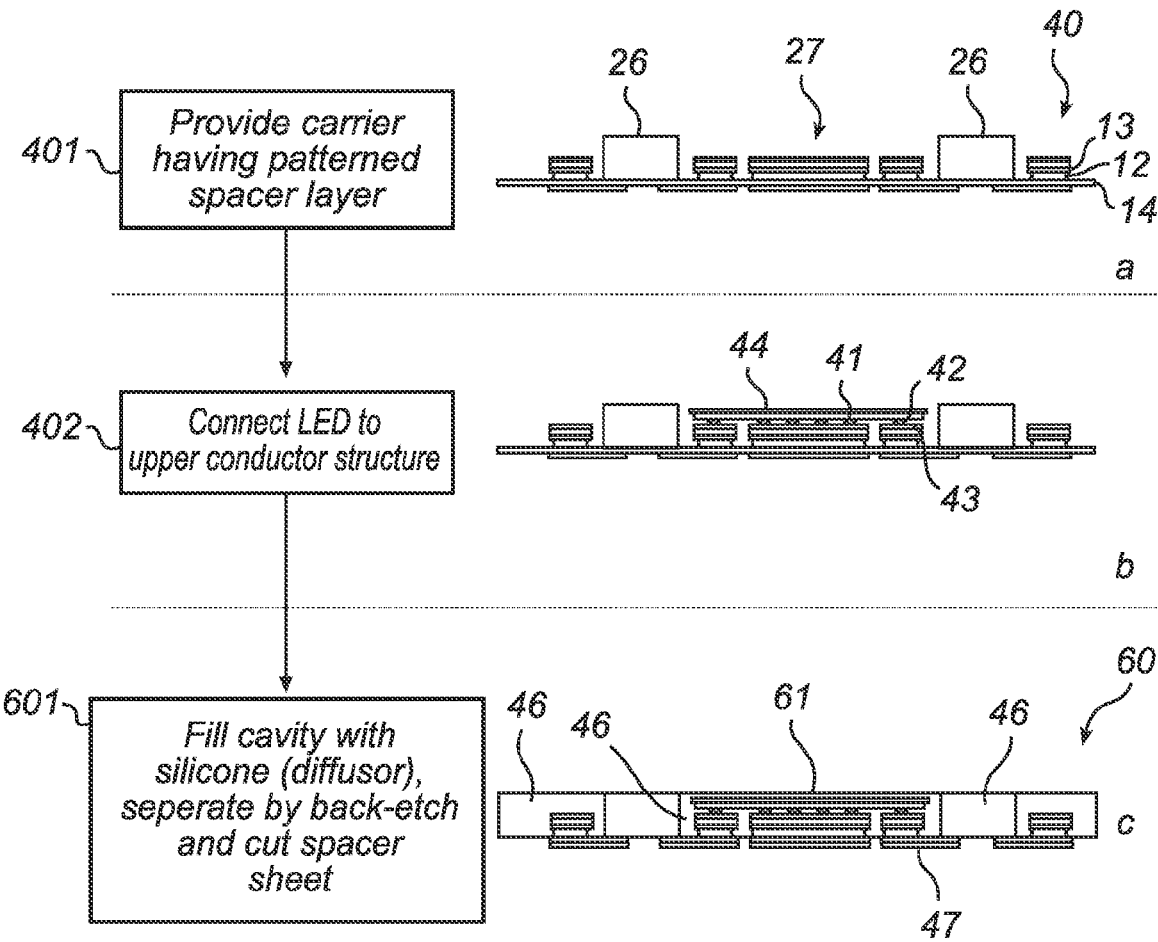
FIG. 6 is a flow chart schematically illustrating a method for manufacturing a second embodiment of an optical semiconductor device according the present invention.
FIG. 7 schematically illustrates the optical semiconductor device manufactured according to the method of FIG. 6 in states following the corresponding method steps.

The optical semiconductor device 60 and manufacturing method illustrated in FIG. 6 and FIG. 7 differ from the device and method described above in that the optical element 61 is provided, in step 601, by filling the cavity 27 formed in the patterned insulative spacer layer 26 with a liquid, optically active substance which is adapted to act as an optical element when covering the LED 41. In the presently described case, the optically active substance is a silicone, which acts as a diffuser, diffusing the light emitted by the LED 41. Hereby, the location of the diffuser 61 is defined by the patterned insulative spacer layer 26 and the cavity 27 formed therein.

As described above in connection with step 403 and FIG. 5 step c, a lower conductor structure 47 is formed and the panel is separated by cutting the patterned insulative spacer layer 26 in appropriate locations.

The person skilled in the art realizes that the present invention by no means is limited to the preferred embodiments described above. For example, the patterned insulative spacer layer may be provided as a pre-patterned layer having at least one pre-formed cavity, or may be spin-coated and subsequently patterned. Furthermore, several optical semiconductor elements, such as differently colored LEDs may be connected to the upper conductor structure inside one cavity to form a white, or variable-color, LED-cluster. Additionally, the present invention is applicable to other optical semiconductor elements than LEDs, such as photo-sensors, lasers, etc.

Moreover, other components which are needed to control the LED(s), such as optical flux/color sensors, temperature sensors to be used in closed loop control (drivers) of the LED(s) as well as other elements like a non-volatile memory (NVM) (to store data) or other related integrated driver functionality may be connected to the upper conductor structure in the cavity together with the LED(s). Furthermore, the insulative spacer layer may also be structured for use, with or without additional coating, as a reflector to direct the light in certain directions.

Additionally, the carrier according to the present invention, may also be provided with optical and/or mechanical reference points to be used for the placement and interconnect of secondary optical elements, such as collimators, reflectors, mixing rods, etc.

The invention claimed is:

1. An optical semiconductor device comprising:
a carrier for enabling accurate positioning of a first optical element in relation to an optical semiconductor element, said carrier comprising:
an electrically conductive multi-layer carrier base sheet having an upper carrier layer, a lower carrier layer, and an intermediate carrier layer between said upper carrier layer and said lower carrier layer, said upper carrier layer and said intermediate carrier layer having an upper conductor structure formed in said upper carrier layer and said intermediate carrier layer; and
a patterned insulative spacer layer arranged on an upper carrier layer side of said carrier base sheet and arranged such that at least a portion of the patterned insulative spacer layer is disposed below said upper carrier layer, wherein:
said patterned insulative spacer layer is patterned such that at least one cavity is formed in which said optical semiconductor element is connectable to said upper conductor structure, a depth of said cavity being greater than a height of the optical semiconductor element when connected to said carrier; and
said cavity is formed to define a location of said first optical element in relation to said optical semiconductor element;
the optical semiconductor element connected to said upper conductor structure in the cavity formed by said patterned insulative spacer layer; and
said first optical element is provided in said location defined by said patterned insulative spacer layer.

2. The optical semiconductor device according to claim 1, wherein said optical semiconductor element is connected to said upper conductor structure by bumps that are provided on the optical semiconductor element and are connected to pads in the upper conductor structure.

3. The optical semiconductor device according to claim 1, wherein an extension of said first optical element is determined by said cavity.

4. The optical semiconductor device according to claim 1, wherein a space defined by said cavity and said first optical element is at least partially filled with a resilient optical compound, for reducing stress on the optical semiconductor device.

5. The optical semiconductor device according to claim 1, wherein the carrier further comprises:
an intermediate insulative layer arranged between said upper carrier layer and said patterned insulative spacer layer,
wherein said intermediate insulative layer is configured such that an electrical connection between connector bumps provided on said optical semiconductor element and said upper conductor structure is implemented through said intermediate insulative layer by applying heat and pressure to said optical semiconductor element when the optical semiconductor element is positioned on said intermediate insulative layer with said connector bumps facing the intermediate insulative layer.

* * * * *